United States Patent [19]
D'Asaro et al.

[11] 3,805,376

[45] Apr. 23, 1974

[54] BEAM-LEAD ELECTROLUMINESCENT DIODES AND METHOD OF MANUFACTURE

[75] Inventors: Lucian Arthur D'Asaro, Madison; Matthew Kuhn, Warren; Stuart Marshall Spitzer, Berkeley Heights, all of, NJ

[73] Assignee: Bell Telephone Laboratories, Incorporated, Murray Hill, N.J.

[22] Filed: Dec. 2, 1971

[21] Appl. No.: 203,978

[52] U.S. Cl. .......................... 29/590, 29/580, 29/576

[51] Int. Cl. .......................... B01j 17/00

[58] Field of Search 29/576 B, 576 E, 580, 576 IW, 29/589, 590; 317/235, 48, 9

[56] References Cited

UNITED STATES PATENTS

| | | | |
|---|---|---|---|
| 3,386,864 | 6/1968 | Silvestri et al. | 29/576 E |
| 3,396,317 | 8/1968 | Vendelin | 29/576 E |
| 3,423,651 | 1/1969 | Legat et al. | 29/576 IW |
| 3,550,261 | 12/1970 | Schroeder | 29/589 |

OTHER PUBLICATIONS

"Isolation of Junction Devices in GaAs Using Proton Bombardment," Solid State Electronics, Vol. 12, pp. 209–214, Apr. 1969, by Foyt et al.

*Primary Examiner*—W. C. Tupman
*Attorney, Agent, or Firm*—L. H. Birnbaum

[57] ABSTRACT

A beam-leaded electroluminescent diode structure and a method of manufacture are described. The p–n junction is formed such that the junction extends to the top surface of the semiconductor crystal. Proton bombardment of the surface forms insulating regions within the crystal which passivate the *p–n* junction and permit co-planar or quasiplanar connections through beam lead technology. Metal contacts which are opaque to the proton beam are used for masking during bombardment. These contacts are subsequently built up to form the beam leads.

8 Claims, 10 Drawing Figures

BEAM-LEAD ELECTROLUMINESCENT DIODES AND METHOD OF MANUFACTURE

BACKGROUND OF THE INVENTION

This invention relates to electroluminescent diodes formed by planar processing and contacted on one surface of the diode through beam-lead technology.

The existence of beam-lead technology has brought considerable improvements to the field of electroluminescent diodes. Aside from the ease of contacting to integrated arrays, another advantage of beam-leaded over wire-bonded diodes lies in the higher luminescent efficiency associated with the former. Since the beam leads are formed on one surface of the diode, light may be transmitted through the opposite surface uninhibited by any contact. By making the leads as reflecting as possible, light emission is further enhanced. Furthermore, a heavily doped substrate is not needed in the beam-lead configuration and so light transmission through the substrate is relatively unhampered by impurities.

Typical prior art beam-leaded devices have relied upon deposited oxide layers to passivate the p-n junction and to provide the necessary insulation for a co-planar contact (see, for example, Lynch et al "Planar Beam-Lead Gallium Arsenide Electroluminescent Arrays," *IEEE Transactions on Electron Devices*, Vol. ED-14, pp. 705–709 (Oct. 1967)). These deposited oxides, however, provide poor adhesion to the semiconductor material and reliability of the beam-lead bond is sacrificed.

It is therefore a primary object of the present invention to provide an electroluminescent diode with strong and reliable beam-lead bonds.

SUMMARY OF THE INVENTION

This and other objects are achieved in accordance with the invention which utilizes proton bombardment to form passivating and insulating regions in the semiconductor crystal itself rather than the prior art use of chemically deposited oxides on the surface. According to one embodiment of the present invention, the *p–n* junction is formed by liquid phase epitaxial techniques such that the junction extends to the top surface of the semiconductor crystal. Metal contacts are deposited on the surface to contact the n and p regions. The surface is then irradiated with a proton beam to form insulating regions within the crystal, the metal contacts performing a masking function. The contacts are then built up to form the beam leads.

BRIEF DESCRIPTION OF THE DRAWING

These and other features of the invention are delineated in detail in the description to follow and in the drawing in which.

DETAILED DESCRIPTION

The sequence of steps illustrated in FIGS. 1A–1H best demonstrates the teachings of the invention. While the embodiment described refers to GaP diodes, it should be clear that the principles of the invention may be applied to other electroluminescent devices, such as for example, gallium arsenide and gallium-arsenide-phosphide diodes.

Figure 1A:
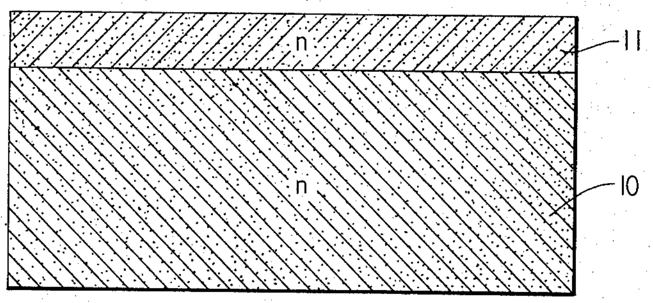
FIGS. 1A–1H are cross-sectional views of an electroluminescent diode in successive stages of manufacture in accordance with one embodiment of the invention.

In FIG. 1A an *n*-type semiconductor substrate, 10, comprising GaP has grown thereon a layer of tellurium-doped GaP of n-conductivity type, 11, by liquid phase epitaxial techniques well known in the art. The layer 11 is typically grown to a thickness of approximately 50 microns and has a free carrier concentration of approximately 6–8 × $10^{17}$ electrons/$cm^3$. Since no current is required to flow in the substrate, 10, in the operation of the final device, an undoped, high resistivity substrate may be used. This will increase the external electroluminescent efficiency of the device due to reduced free carrier absorption. The carrier concentration of the substrate can be typically about $10^{16}$ electrons/$cm^3$ or less. The chemical contamination which is normally associated with the doping of the substrate and which may affect the lifetime of the device is therefore eliminated. Liquid phase epitaxy is chosen as the means of junction formation since it produces films with better electroluminescent properties than are presently possible with vapor phase epitaxy or diffusion techniques. However, these methods may be employed if desired.

Figure 1B:
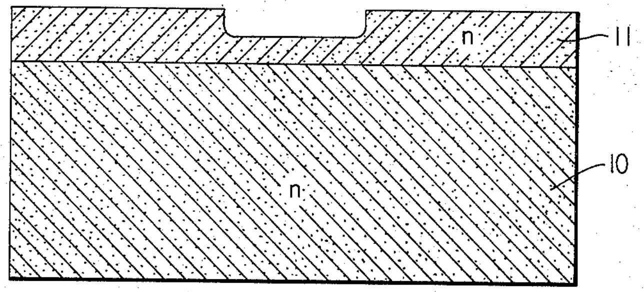
Figure 1C:
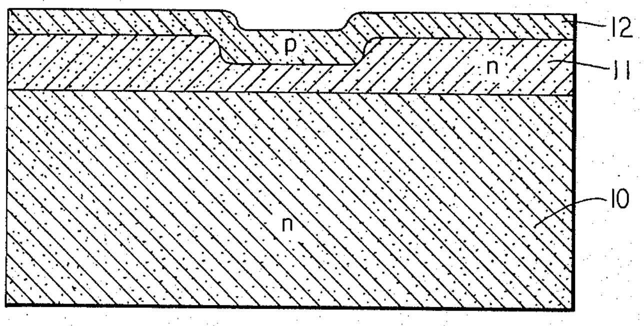

In FIG. 1B, a hole has been etched in the epitaxial layer to a depth of about 25 microns by a suitable etchant such as an aqueous solution of hydrogen peroxide and sulfuric acid. As shown in FIG. 1C, a layer of zinc-doped GaP of p-conductivity type, 12, is then epitaxially grown over layer 11 to fill the depression and establish a p-n junction at the boundary between the two layers. The carrier concentration in layer 12 is typically 2–4 × $10^{17}$ holes/$cm^3$.

Figure 1D:
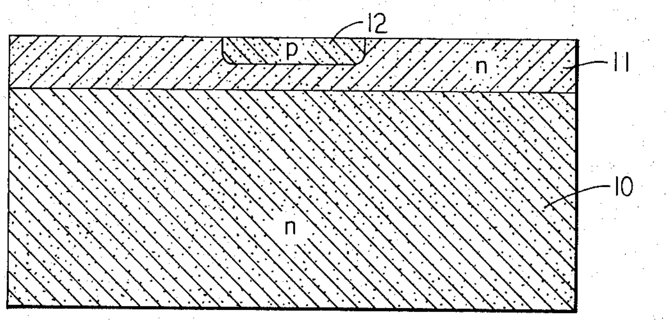

The device is then etched or polished to a sufficient depth to expose the underlying *n*-layer 11, such that the *n* and *p* regions form a planar top surface. The *p–n* junction between the two epitaxial layers now extends to the top surface of the device as shown in FIG. 1D. Many other methods may be used consistent with the invention to achieve the structure shown in FIG. 1D, such as ion implantation and diffusion techniques. These techniques are well known in the art and therefore a detailed discussion here is unnecessary.

Figure 1E:
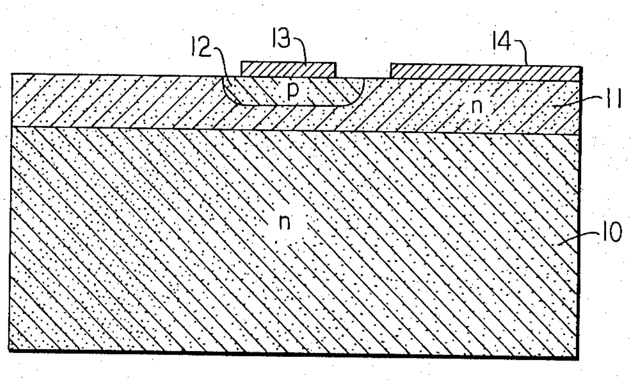

At the stage shown in FIG. 1E, metal contacts 13 and 14 have been deposited on the surface of the device in order to provide electrical contact to the *p* and *n* regions respectively. The contact to the *p* region, 13, is an acceptor-doped metal layer such as beryllium-doped gold, while the contact to the *n* region, 14, is a donor-doped metal such as silicon-doped gold. The metal is deposited on the surface by conventional techniques, e.g., sputtering or vapor deposition, using well-known masking techniques to produce the geometry shown in FIG. 1E. The device may then be heated to about 600° C. for approximately five minutes to establish ohmic contact.

These contacts will also serve as the mask for the subsequent proton bombardment and so should be deposited to a sufficient thickness to act as a barrier to the proton beam. For example, a thickness of three microns of gold is sufficient for a proton bombardment of 300 keV. In general, about one micron of metal is needed for each 100 keV increment of proton energy.

Figure 1F:
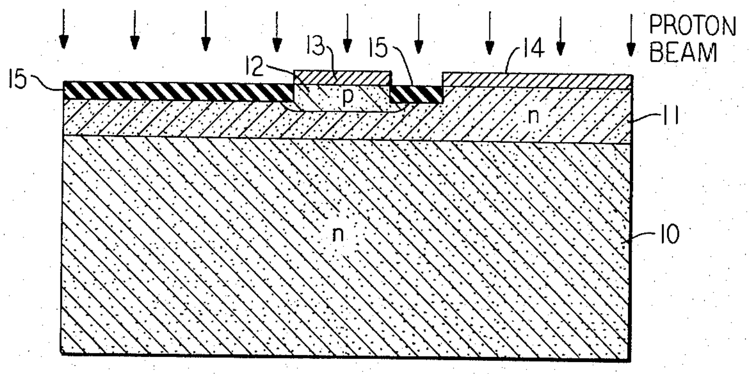

In the next step, illustrated in FIG. 1F, the top surface of the diode is irradiated with a proton beam to form a high resistivity region 15 within the semiconductor crystal in the area left exposed by the metal contacts. Insulating region 15 serves to passivate the *p–n* junction at the surface and, in addition, to insulate the *n* layer from the subsequently formed beam lead. By "passivation" it is meant that electrical surface stability is provided so as, for example, to suppress surface leakage current.

Figure 2:
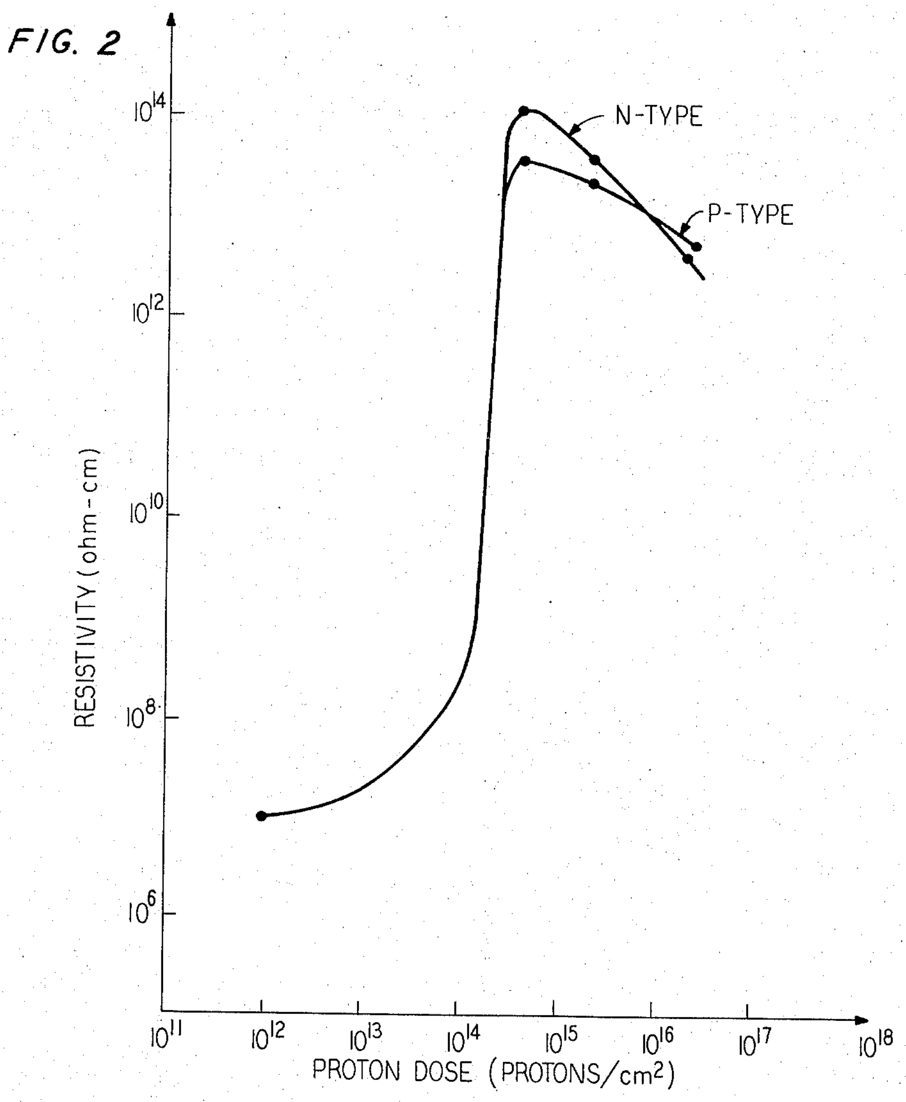
FIG. 2 is a plot of the resistivity of GaP as a function of proton dose according to the same embodiment.

It was found that a proton beam at 300 keV and an exposure of $4 \times 10^{14}$ protons/cm$^2$ produces a layer which is about 24 microns thick wherein the resistivity of the crystal is increased to approximately $8 \times 10^{13}$ ohm-cm. Of course, the values of proton energy and exposure may be varied according to particular needs of resistivity and depth penetration. In regard to exposure, several factors should be considered. It was discovered, as shown in FIG. 2, that the resistivity of a GaP crystal will reach a maximum with a proton dose of about $4 \times 10^{14}$ protons/cm$^2$ and will fall off if higher dosages are supplied. This is apparently the result of overcompensation of free carriers in the crystal by the proton beam. In addition, if the dosage is high, the proton bombarded region will become opaque. This optical absorption can be eliminated by subsequent annealing while still retaining high resistivity. This annealing process is fully described and claimed in U.S. patent application of L.A. D'Asaro-J.C. Dyment-M. Kuhn-S.M. Spitzer Case 10-4-6- 3, filed on an even date herewith. A typical anneal adequate for the present purpose is approximately 400° C. for 10 minutes, although a range of 300°–600° C. for one hour to five minutes may be utilized. Alternatively, the problem of optical absorption can be reduced by bombarding at dosages below $10^{15}$ protons/cm$^2$ where no significant absorption is produced. A useful dosage range for GaP with a carrier concentration of about $2–8 \times 10^{17}$ carriers/cm$^2$ is therefore approximately $10^{14}$ to $10^{17}$ protons/cm$^2$. The same dosage range is applicable to GaAs for the same reasons.

In beam-leaded electroluminescent devices in general, it will be desirable to increase the resistivity of the crystal to at least $10^5$ ohm-cm to provide proper insulation, and the exposure may be adjusted accordingly. The depth of the high resistivity region will be approximately one micron for every increment of 100 keV of proton energy (see Foyt et al, "Isolation of Junction Devices in GaAs Using Proton Bombardment," *Solid-State Electronics*, Vol. 12, pp. 209–214 (1969)).

It will be appreciated from the discussion herein that proton bombardment is totally compatible with subsequent contacting and beam-lead fabrication.

The use of proton bombardment to form insulating regions supplies at least two advantages over prior art devices which require a separate insulating layer. First, a strong beam-lead bond is formed since the insulating region is part of the crystal itself. Second, processing can be simplified since it is not necessary to consider limitations imposed by the chemical properties of an additional layer of insulating material.

Certain restrictions as to the type of semi-conductor compound utilized in the present invention must be pointed out. In particular, the band gap of the semiconductor must be wide enough so that carriers trapped in the forbidden region in the proton-bombardment areas will not reach the conduction band as a result of thermal energy at room temperature. A material such as germanium, for example, may not be adequate. In general, it can be estimated that the principles of the present invention are applicable to any semiconductor material, including binary, ternary and quadrinary compounds, which possesses a band gap of at least 1 eV. Examples of useful materials for electroluminescent devices, in addition to GaP, are GaAs, GaAlAs and GaAsP.

Figure 1G:
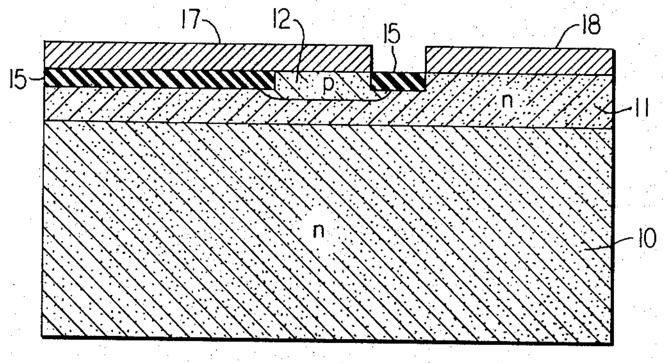

After the proton bombardment step, the contacts may be built up to form beam leads 17 and 18 as illustrated in FIG. 1G. Beam leads may be fabricated by a variety of methods and metallurgical combinations known in the art (see, for example, M. P. Lepselter, "Beam Lead Technology," *Bell System Technical Journal*, Vol. 45, pp. 233–253 (February 1966)).

One convenient method is to deposit a reactive metal such as chromium over selected areas of the crystal using conventional masking techniques, followed by electroplating gold over these areas and over the metal contacts to build beam leads of approximately ten microns thickness. An alternate procedure would be to deposit thin chromium and gold layers over the entire slice before the metal contacts are formed. The contacts are then deposited after etching holes in these layers above the *n* and *p* regions. Following proton bombardment, gold is electroplated in selected areas using photoresist techniques to form the beam leads in the desired geometry and the exposed chromium-gold is etched away.

Figure 1H:
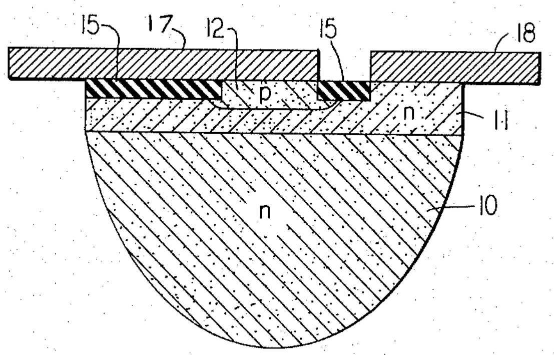

In the final steps, the slice is cut from the back using a slurry saw and etched with a solution such as $H_2O_2$ and $H_2SO_4$ so that the beam leads extend beyond the edges of the device and the substrate is rounded for maximum light transmission. The final device is illustrated in FIG. 1H.

Figure 3:
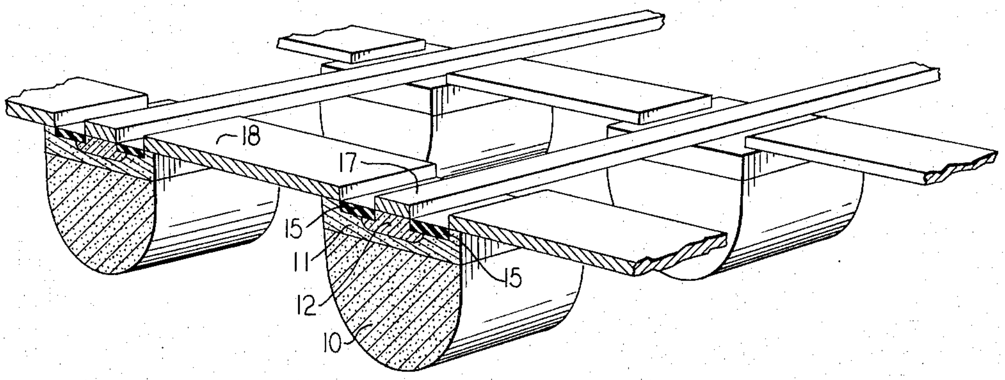
FIG. 3 is a perspective view, partly in cross section, of a portion of an array of electroluminescent diodes in accordance with another embodiment of the invention.

It should be understood that the term "beam lead" as used here is not limited to any particular material or layers of materials. It is meant to include any electrical contact which also provides structural support for the device when interconnected to other circuit elements. The process has been described here in terms of forming an individual diode structure. It should be clear that the principles discussed may be easily applied to the planar batch processing of several devices on a single slice and to the formation of integrated arrays of devices. An example of an X-Y array of devices is illustrated in FIG. 3. The proton bombarded regions 15 are indicated in the figure and perform the same function of passivation and insulation. Cross-overs are provided through the *n*-type epitaxial layer 11. It should be emphasized that none of these figures is drawn to scale.

It should also be noted that a mesa structured device is equally adaptable to the principles discussed herein. The *p–n* junction in this case is formed by depositing two layers of semiconductor material of opposite conductivity type on a substrate followed by etching of the surface of the top layer in selected areas to leave the mesa structure. Proton bombardment proceeds as in the case of the planar structure. Beam leads are then formed in a quasi-planar pattern. (For an example of a mesa structure beam-leaded device, see application of M. Kuhn and N. Schumaker, Ser. No. 84,049, filed Oct. 26, 1970 and assigned to the present assignee.)

Various additional modifications and extensions will become apparent to those skilled in the art. All such variations and deviations which basically rely on the teachings through which this invention has advanced the art are properly considered within the spirit and scope of this invention.

We claim:

1. A method of making an electroluminescent device comprising the steps of:

forming a layer of semiconductor material of one conductivity type covering one surface of a light transmitting semiconductor wafer, forming a region of semiconductor material of opposite conductivity type contiguous to a portion of said layer so as to form a *p–n* junction which is exposed at the surface defined by said region and said layer, depositing metal contacts on said surface so as to provide electrical contact to said region and said layer, irradiating the resulting structure including the semiconductor material at said exposed junction with a proton beam so as to form an insulating region within the semiconductor material at the exposed semiconductor surface, and building up said contacts including protons extending over said insulating region so as to form beam leads.

2. The method according to claim 1 wherein the region of semiconductor material is formed so as to define a planar surface with said layer of semiconductor material.

3. The method according to claim 1 wherein the region of semiconductor material is formed so as to define a mesa structure with said layer.

4. The method according to claim 1 wherein the semiconductor material has a band gap of at least 1 eV.

5. The method according to claim 1 wherein the semiconductor material is selected from the group consisting of GaP, GaAs, GaAlAs, and GaAsP.

6. The method according to claim 1 wherein the semiconductor material is GaP.

7. The method according to claim 6 wherein the exposure of the proton beam is $10^{14} - 10^{17}$ protons/cm$^2$.

8. The method according to claim 1 wherein the exposure of the proton beam is sufficient to raise the resistivity of the semiconductor material to at least $10^5$ ohm-cm.

* * * * *

UNITED STATES PATENT OFFICE
CERTIFICATE OF CORRECTION

Patent No. 3,805,376 Dated April 23, 1974

Inventor(s) Lucian A. D'Asaro, Matthew Kuhn, and Stuart M. Spitzer

It is certified that error appears in the above-identified patent and that said Letters Patent are hereby corrected as shown below:

Column 6, line 2, change "protons" to --portions--.

Signed and sealed this 17th day of September 1974.

(SEAL)
Attest:

McCOY M. GIBSON JR.
Attesting Officer

C. MARSHALL DANN
Commissioner of Patents

RM PO-1050 (10-69)

USCOMM-DC 60376-P69
U.S. GOVERNMENT PRINTING OFFICE : 1969 O—366-334.